(12) United States Patent
Takenaka

(10) Patent No.: US 12,126,370 B2
(45) Date of Patent: Oct. 22, 2024

(54) HIGH-FREQUENCY MODULE AND COMMUNICATION APPARATUS

(71) Applicant: Murata Manufacturing Co., Ltd., Kyoto (JP)

(72) Inventor: Isao Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 337 days.

(21) Appl. No.: 17/807,512

(22) Filed: Jun. 17, 2022

(65) Prior Publication Data

US 2022/0321154 A1 Oct. 6, 2022

Related U.S. Application Data

(63) Continuation of application No. PCT/JP2020/045266, filed on Dec. 4, 2020.

(30) Foreign Application Priority Data

Feb. 7, 2020 (JP) .................................. 2020-019941

(51) Int. Cl.
*H04B 1/04* (2006.01)
*H01L 23/66* (2006.01)
(Continued)

(52) U.S. Cl.
CPC ............... *H04B 1/04* (2013.01); *H01L 23/66* (2013.01); *H03F 3/24* (2013.01);
(Continued)

(58) Field of Classification Search
CPC ... H04B 1/04; H01L 23/66; H01L 2223/6644; H03F 3/24; H03F 1/565; H03F 2200/165; H03F 2200/451
See application file for complete search history.

(56) References Cited

U.S. PATENT DOCUMENTS 6,487,085 B1\* 11/2002 Kimura ................... H01L 23/66
174/541
2009/0268711 A1\* 10/2009 Ventola ............... H04L 27/0012
370/350
(Continued)

FOREIGN PATENT DOCUMENTS

WO 2019/054176 A1 3/2019
WO 2019/065419 A1 4/2019
WO 2019/065569 A1 4/2019

OTHER PUBLICATIONS

International Search Report for PCT/JP2020/045266 dated Feb. 9, 2021.

*Primary Examiner* — Dominic E Rego
(74) *Attorney, Agent, or Firm* — Pearne & Gordon LLP

(57) ABSTRACT

In a high-frequency module, a plurality of filters are connected to a first switch. A plurality of amplifiers are connected to a second switch. A first inductor is disposed on a common path between a second common terminal of the second switch and a first common terminal of the first switch. A plurality of second inductors are disposed, on a one-to-one correspondence, in sections different from the common path, the sections being included in the plurality of respective signal paths. The first inductor is a surface mount inductor located on a first main surface of a mounting substrate. The plurality of second inductors are each an inductor disposed within an IC chip including the plurality of amplifiers or an inductor including a conductive pattern formed in or on the mounting substrate.

14 Claims, 8 Drawing Sheets

(51) Int. Cl.
*H03F 3/24* (2006.01)
*H04B 1/38* (2015.01)
*H03F 1/56* (2006.01)

(52) U.S. Cl.
CPC ...... *H01L 2223/6644* (2013.01); *H03F 1/565* (2013.01); *H03F 2200/165* (2013.01); *H03F 2200/451* (2013.01)

(56) References Cited

U.S. PATENT DOCUMENTS

| | | | |
|---|---|---|---|
| 2010/0233972 A1* | 9/2010 | Kashiwagi | H04B 1/0067 455/77 |
| 2014/0312978 A1* | 10/2014 | Nagamori | H03F 3/195 330/295 |
| 2017/0134057 A1* | 5/2017 | Kim | H04B 1/18 |
| 2017/0294947 A1* | 10/2017 | Little | H04B 7/0825 |
| 2017/0302328 A1* | 10/2017 | Obiya | H04B 1/525 |
| 2017/0338839 A1* | 11/2017 | Little | H04B 1/56 |
| 2018/0041174 A1* | 2/2018 | Muto | H03F 3/195 |
| 2018/0041188 A1* | 2/2018 | Shoda | H03F 1/26 |
| 2018/0190601 A1* | 7/2018 | Hitomi | H03F 3/213 |
| 2018/0226928 A1* | 8/2018 | Obiya | H04B 1/00 |
| 2018/0248569 A1* | 8/2018 | Takenaka | H04B 1/0057 |
| 2018/0337643 A1* | 11/2018 | Yoshimi | H03F 3/211 |
| 2018/0367168 A1* | 12/2018 | Lee | H04B 1/0057 |
| 2019/0068128 A1* | 2/2019 | Sun | H03F 1/083 |
| 2019/0103843 A1* | 4/2019 | Aikawa | H03F 3/189 |
| 2020/0220568 A1 | 7/2020 | Watanabe | |
| 2020/0228073 A1 | 7/2020 | Naniwa | |
| 2020/0228074 A1 | 7/2020 | Naniwa et al. | |

\* cited by examiner

HIGH-FREQUENCY MODULE AND COMMUNICATION APPARATUS

CROSS REFERENCE TO RELATED APPLICATION

This is a continuation of International Application No. PCT/JP2020/045266 filed on Dec. 4, 2020 which claims priority from Japanese Patent Application No. 2020-019941 filed on Feb. 7, 2020. The contents of these applications are incorporated herein by reference in their entireties.

BACKGROUND ART

Technical Field

The present disclosure typically relates to a high-frequency module and a communication apparatus and in more detail relates to a high-frequency module including a plurality of filters and a plurality of amplifiers and a communication apparatus including the same.

To date, a front-end module (high-frequency module) including a plurality of filters, a plurality of amplifiers, a second switch IC, and a plurality of inductors (matching elements) connected to the plurality of amplifiers on a one-to-one correspondence is known (for example, see Patent Document 1).

The second switch IC has one common terminal and a plurality of selection terminals, and the plurality of filters are connected to the plurality of selection terminals. The plurality of inductors are disposed on respective paths that are each between the common terminal of the second switch IC and a corresponding one of the plurality of amplifiers. The plurality of inductors are herein disposed on the mutually different paths.

Patent Document 1: International Publication No. 2019/054176

BRIEF SUMMARY

In a high-frequency module such as a front-end module disclosed in Patent Document 1, each of the plurality of inductors is likely to be of a large size, and the high-frequency module is desired to be downsized on occasions.

The present disclosure provides a high-frequency module and a communication apparatus that enable downsizing.

A high-frequency module according to an aspect of the present disclosure includes a plurality of filters, a plurality of amplifiers, a first switch, a second switch, a first inductor, a plurality of second inductors, and a mounting substrate. The plurality of filters are connectable to an antenna terminal. The first switch has a first common terminal and a plurality of first selection terminals. The first switch has the plurality of first selection terminals to which the plurality of respective filters are connected. The second switch has a second common terminal and a plurality of second selection terminals. The second switch has the plurality of second selection terminals to which the plurality of respective amplifiers are connected. The first inductor is located on a common path between the first common terminal and the second common terminal, the common path being included in a plurality of signal paths each of which is between a corresponding one of the plurality of filters and a corresponding one of the plurality of amplifiers. The plurality of second inductors are disposed, on a one-to-one correspondence, in sections different from the common path, the sections being included in the plurality of respective signal paths. The mounting substrate has a first main surface and a second main surface that are opposite to each other. The first inductor is a surface mount inductor located on the first main surface of the mounting substrate. The plurality of second inductors are each an inductor disposed within the IC chip including the plurality of amplifiers or an inductor including a conductive pattern formed in or on the mounting substrate.

A communication apparatus according to an aspect of the present disclosure includes the high-frequency module according to the aspect above and a signal processing circuit. The signal processing circuit is connected to the high-frequency module. The signal processing circuit performs signal processing of a high-frequency signal.

The high-frequency module and the communication apparatus according to the aspects of the present disclosure enable downsizing.

DETAILED DESCRIPTION

Figure 1:
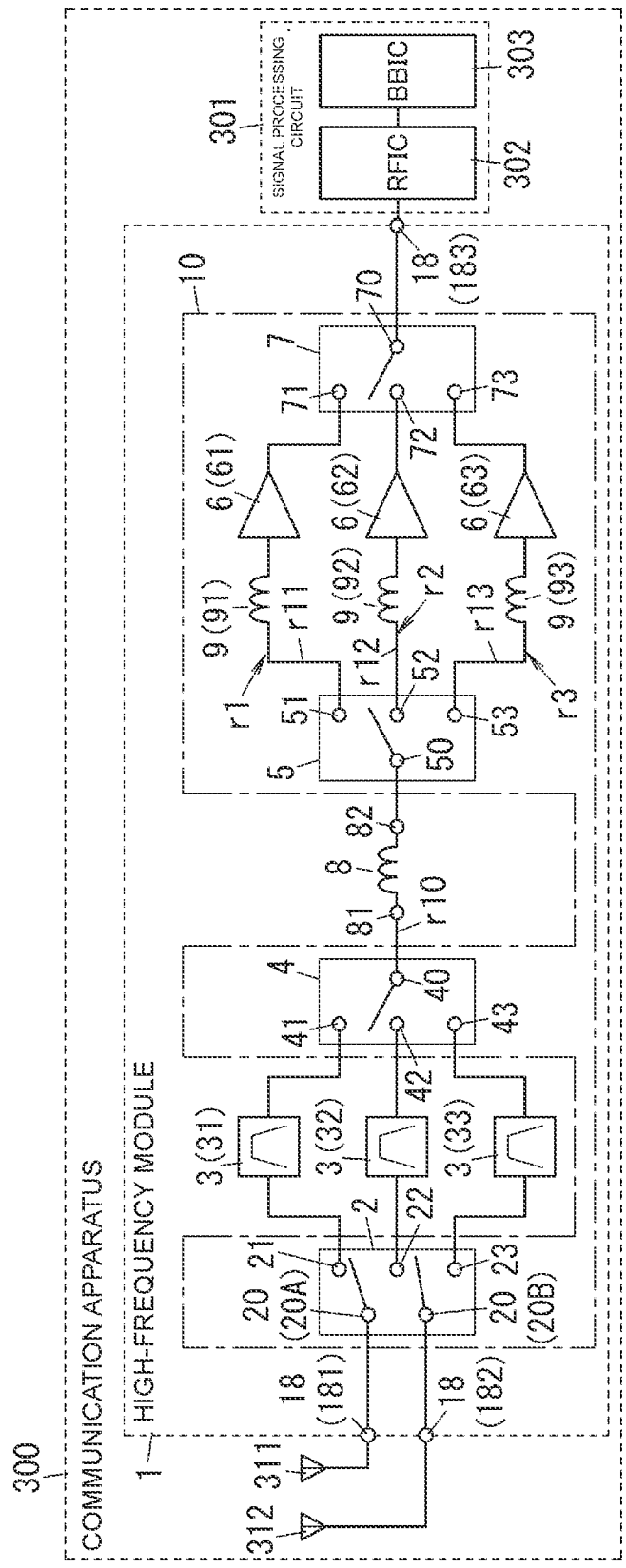
FIG. 1 is a circuit diagram of a high-frequency module according to Embodiment 1 and a communication apparatus including the same.

FIGS. 2A, 2B, 3, 8A, and 8B referred to in the following embodiments and the like are each a schematic view, and the size, the depth, and the ratio of the size and the depth of each component do not necessarily reflect an actual scale ratio.

Embodiment 1

Hereinafter, a high-frequency module 1 and a communication apparatus 300 according to Embodiment 1 will be described with reference to FIGS. 1, 2A, and 2B.

(1) High-Frequency Module and Communication Apparatus
(1.1) Circuit Configuration of High-Frequency Module and Communication Apparatus The circuit configuration of the high-frequency module 1 and the communication apparatus 300 according to Embodiment 1 will be described with reference to FIG. 1.

The high-frequency module 1 according to Embodiment 1 is used, for example, for the communication apparatus 300. The communication apparatus 300 is, for example, a cellular phone (for example, a smartphone) but is not limited to this. The communication apparatus 300 may be, for example, a wearable terminal (for example, a smart watch). The high-frequency module 1 is, for example, a module that can support a fourth-generation mobile communication (4G) standard and a fifth-generation mobile communication (5G) standard. The 4G standard is, for example, the 3GPP long term evolution (LTE) standard. The 5G standard is, for example, the 5G new radio (NR). The high-frequency module 1 is a module that can support carrier aggregation and dual connectivity. That is, the high-frequency module 1 is a module that can support communications simultaneously performed.

The high-frequency module 1 is configured to be able to, for example, amplify a transmission signal input from a signal processing circuit 301 and output the signal to an antenna 311 or an antenna 312. The high-frequency module 1 is configured to be able to also amplify a reception signal input from the antenna 311 or the antenna 312 and output the signal to the signal processing circuit 301. The signal processing circuit 301 is not a component of the high-frequency module 1 but is a component of the communication apparatus 300 including the high-frequency module 1. The high-frequency module 1 according to Embodiment 1 is controlled by, for example, the signal processing circuit 301 included in the communication apparatus 300. The communication apparatus 300 includes the high-frequency module 1 and the signal processing circuit 301. The communication apparatus 300 further includes the antenna 311. The communication apparatus 300 further includes the antenna 312 different from the antenna 311. The communication apparatus 300 further includes a circuit substrate on which the high-frequency module 1 is mounted. The circuit substrate is, for example, a printed-circuit board plate. The circuit substrate has a ground electrode given the ground potential.

The signal processing circuit 301 includes, for example, a RF signal processing circuit 302 and a baseband-signal processing circuit 303. The RF signal processing circuit 302 is, for example, a radio frequency integrated circuit (RFIC) and performs signal processing of a high-frequency signal. The RF signal processing circuit 302 performs signal processing such as upconverting of a high-frequency signal (transmission signal) output from, for example, the baseband-signal processing circuit 303 and outputs the high-frequency signal subjected to the signal processing to the high-frequency module 1. The RF signal processing circuit 302 performs signal processing such as downconverting of a high-frequency signal (reception signal) output from, for example, the high-frequency module 1 and outputs the high-frequency signal subjected to the signal processing to the baseband-signal processing circuit 303. The baseband-signal processing circuit 303 is, for example, a baseband integrated circuit (BBIC). The baseband-signal processing circuit 303 generates an I-phase signal and a Q-phase signal from a baseband signal. The baseband signal is, for example, a sound signal or an image signal input from outside. The baseband-signal processing circuit 303 performs IQ modulation processing by combining the I-phase signal and the Q-phase signal and then outputs a transmission signal. At this time, the transmission signal is generated as a modulation signal (IQ signal) resulting from amplitude modulation of a carrier signal in a predetermined frequency, the amplitude modulation being performed with a period longer than the period of the carrier signal. The reception signal processed by the baseband-signal processing circuit 303 is used, for example, as an image signal for image display or as a sound signal for calling. The high-frequency module 1 transmits a high-frequency signal (a reception signal or a transmission signal) between the antenna 311 or the antenna 312 and the RF signal processing circuit 302 of the signal processing circuit 301.

The high-frequency module 1 according to Embodiment 1 includes a plurality of (for example, three) filters 3, a plurality of (for example, three) amplifiers 6, a first switch 4, a second switch 5, a first inductor 8, and a plurality of (for example, three) second inductors 9. The plurality of (for example, three) filters 3 are connectable to an antenna terminal 181 and an antenna terminal 182. The first switch 4 has a first common terminal 40 and a plurality of (for example, three) first selection terminals 41 to 43. The first switch 4 has the plurality of first selection terminals 41 to 43 to which the plurality of filters 3 are respectively connected. The first switch 4 herein has the plurality of first selection terminals 41 to 43 to which the plurality of filters 3 are connected on a one-to-one correspondence. The second switch 5 has a second common terminal 50 and a plurality of (for example, three) second selection terminals 51 to 53. The second switch 5 has the plurality of second selection terminals 51 to 53 to which the plurality of amplifiers 6 are respectively connected. The second switch 5 herein has the plurality of second selection terminals 51 to 53 to which the plurality of amplifiers 6 are connected on a one-to-one correspondence. The first inductor 8 is disposed on a common path r10 between the first common terminal 40 and the second common terminal 50, the common path r10 being included in a plurality of signal paths r1 to r3 each of which is between a corresponding one of the plurality of filters 3 and a corresponding one of the plurality of amplifiers 6. The plurality of second inductors 9 are disposed, on a one-to-one correspondence, in sections r1 to r13 different from the common path r10, the sections r1 to r13 being included in the plurality of respective signal paths r1 to r3. In a case where the three second inductors 9 are hereinafter discriminated, the three second inductors 9 are also referred to as a second inductor 91, a second inductor 92, and a second inductor 93, respectively.

Figure 2A:
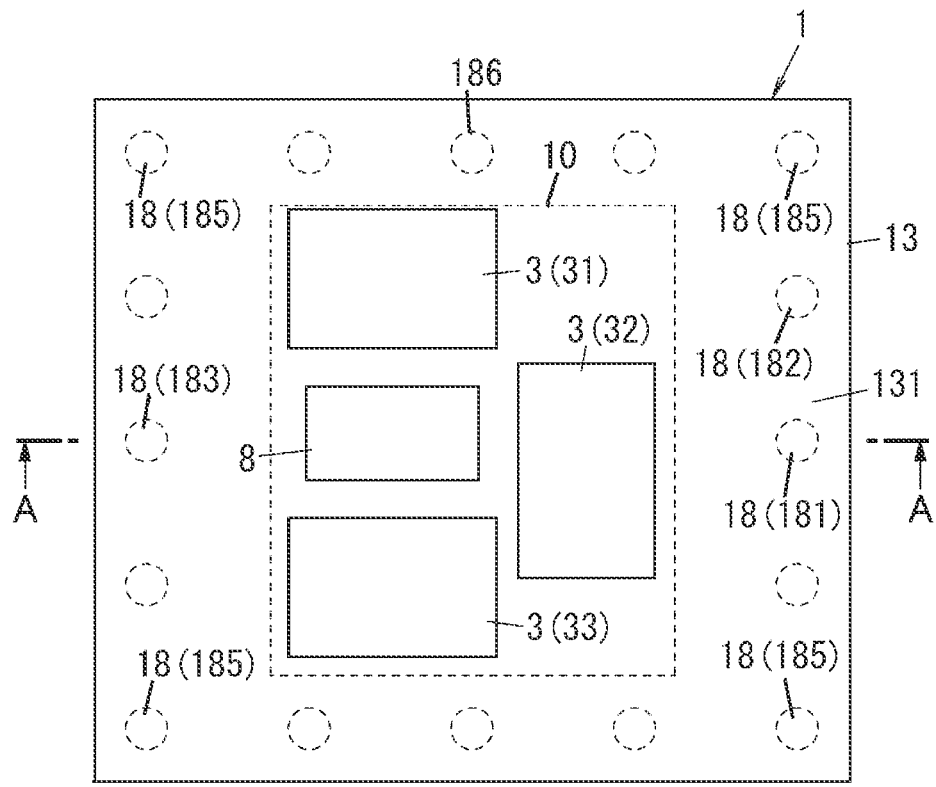
FIG. 2A is a plan view of the high-frequency module as above.
Figure 2B:
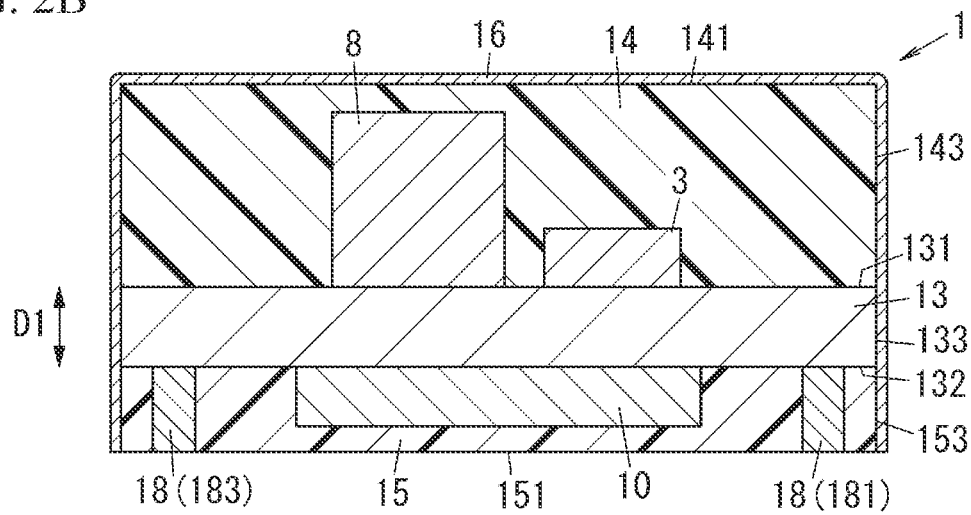
FIG. 2B illustrates the high-frequency module as above and is a cross-sectional view taken along the A-A line in FIG. 2A.

The high-frequency module 1 according to Embodiment 1 also includes a mounting substrate 13 (see FIGS. 2A and 2B). The mounting substrate 13 has a first main surface 131 and a second main surface 132 that are opposite to each other.

Since the first inductor 8 that is a surface mount inductor is disposed on the common path r10 included in the signal paths r1 to r3 each of which is between a corresponding one of the plurality of filters 31 to 33 and a corresponding one of the plurality of amplifiers 61 to 63, the high-frequency module 1 according to Embodiment 1 enables downsizing. the high-frequency module 1 according to Embodiment 1 viewed in a depth direction D1 of the mounting substrate 13 (see FIG. 2B) herein enables downsizing in an outer size as compared with a case where a plurality of matching circuits (input matching circuits) for the plurality of amplifiers 61 to 63 include mutually different surface mount inductors.

In addition, the high-frequency module 1 according to Embodiment 1 further includes a third switch 2. The third switch 2 has third common terminals 20 and a plurality of (for example, three) third selection terminals 21 to 23. The third switch 2 has the two third common terminals 20. The third switch 2 has one of the two third common terminals 20 that is connected to the antenna terminal 181 and the other third common terminal 20 connected to the antenna terminal 182. The third switch 2 has the plurality of third selection terminals 21 to 23 respectively connected to the plurality of filters 3. The third switch 2 herein has the plurality of third selection terminals 21 to 23 connected to the plurality of filters 3 on a one-to-one correspondence.

The high-frequency module 1 according to Embodiment 1 further includes a fourth switch 7. The fourth switch 7 has a fourth common terminal 70 and a plurality of (for example, three) fourth selection terminals 71 to 73. The fourth switch 7 has the fourth common terminal 70 connected to an external connection terminal 18 (a signal output terminal 183). The fourth switch 7 has the plurality of fourth selection terminals 71 to 73 respectively connected to the plurality of amplifiers 6. The fourth switch 7 herein has the plurality of fourth selection terminals 71 to 73 connected to the plurality of amplifiers 6 on a one-to-one correspondence.

(1.2) Components in High-Frequency Module Circuit Configuration (1.2.1) Filters

In the high-frequency module 1, the three filters 3 are each a reception filter. The three filters 3 each has a first terminal (herein an input terminal) and a second terminal (herein an output terminal). The three filters 3 have mutually different pass bands. In a case where the three filters 3 are hereinafter discriminated, the three filters 3 are also referred to as the filter 31, the filter 32, and the filter 33, respectively. The three filters 3 are connectable to the antenna terminal 181. The three filters 3 are herein connected to the antenna terminal 181 with the third switch 2 interposed therebetween. Likewise, the three filters 3 are connectable to the antenna terminal 182. The three filters 3 are herein connected to the antenna terminal 182 with the third switch 2 interposed therebetween. The antenna terminal 181 is connected to, for example, the antenna 311 of the communication apparatus 300. The antenna terminal 182 is connected to, for example, the antenna 312 of the communication apparatus 300. The first terminal (input terminal) of the filter 31 is connected to the third selection terminal 21 of the third switch 2. The second terminal (output terminal) of the filter 31 is connected to the first selection terminal 41 of the first switch 4. The first terminal of the filter 32 is connected to the third selection terminal 22 of the third switch 2. The second terminal of the filter 32 is connected to the first selection terminal 42 of the first switch 4. The first terminal of the filter 33 is connected to the third selection terminal 23 of the third switch 2. The second terminal of the filter 33 is connected to the first selection terminal 43 of the first switch 4.

The filter 31 is, for example, a reception filter having a passband for a reception band as a first communication band included in a predetermined frequency band. The filter 32 is, for example, a reception filter having a passband for a reception band as a second communication band included in the predetermined frequency band. The filter 33 is, for example, a reception filter having a passband for a reception band as a third communication band included in the predetermined frequency band. The first communication band, the second communication band, and the third communication band are mutually different. For the high-frequency module 1, the predetermined frequency band is, for example, low-band. Low-band includes, for example, Band 71, Band 28A, Band 28B, Band 12, Band 13, Band 14, Band 20, Band 26, and Band 8. The communication standard for the communication bands included in the predetermined frequency band is, for example, the LTE standard or the 5G NR standard. Frequency bands in the 5G NR standard using the same frequency bands as those of the 4G LTE standard each has the same band number, and the frequency bands in the 5G NR standard each has a band number prefixed with n.

(1.2.2) Amplifiers

The three amplifiers 6 each has an input terminal and an output terminal. Each amplifier 6 amplifies a high-frequency signal input to the input terminal and then outputs the signal from the output terminal.

In the high-frequency module 1, the three amplifiers 6 are each a low-noise amplifier. Each of the three amplifiers 6 thus amplifies, with low noise, the amplitude of a reception signal that is a high-frequency signal input to the input terminal and outputs the signal from the output terminal. In a case where the three amplifiers 6 are hereinafter discriminated, the three amplifiers 6 are also referred to as the amplifier 61, the amplifier 62, and the amplifier 63, respectively. The amplifier 61 amplifies a high-frequency signal in the first communication band as the reception band and outputs the signal. The amplifier 62 amplifies a high-frequency signal in the second communication band as the reception band and outputs the signal. The amplifier 63 amplifies a high-frequency signal in the third communication band as the reception band and outputs the signal. The high-frequency module 1 further includes the signal output terminal 183 connected to any one of the respective output terminals of the three amplifiers 6 with the fourth switch 7 interposed therebetween.

In the high-frequency module 1, there is a one-to-one correspondence between the three amplifiers 61 to 63 and the three filters 31 to 33. The input terminal of the amplifier 61 is connected to the second selection terminal 51 of the second switch 5 with the second inductor 91 interposed therebetween. The output terminal of the amplifier 61 is connected to the fourth selection terminal 71 of the fourth switch 7. The input terminal of the amplifier 62 is connected to the second selection terminal 52 of the second switch 5 with the second inductor 92 interposed therebetween. The output terminal of the amplifier 62 is connected to the fourth selection terminal 72 of the fourth switch 7. The input terminal of the amplifier 63 is connected to the second selection terminal 53 of the second switch 5 with the second inductor 93 interposed therebetween. The output terminal of the amplifier 63 is connected to the fourth selection terminal 73 of the fourth switch 7.

The amplifier 61 amplifies the high-frequency signal that passes through the filter 31 and outputs the signal. The amplifier 62 amplifies the high-frequency signal that passes through the filter 32 and outputs the signal. The amplifier 63 amplifies the high-frequency signal that passes through the filter 33 and outputs the signal.

(1.2.3) First Switch

The first switch 4 has the first common terminal 40 and the three first selection terminals 41 to 43. The first common terminal 40 is connected to the second common terminal 50 of the second switch 5. In more detail, the first common terminal 40 is connected to the second common terminal 50 of the second switch 5 with the first inductor 8 interposed therebetween. The first selection terminal 41 is connected to the second terminal (output terminal) of the filter 31. The first selection terminal 42 is connected to the second terminal (output terminal) of the filter 32. The first selection terminal 43 is connected to the second terminal (output terminal) of the filter 33. The first switch 4 is, for example, a switch that allows at least one or more of the three first selection terminals 41 to 43 to be connected to the first common terminal 40. Note that the first switch 4 is, for example, a switch that allows one-to-one and one-to-many connection.

The first switch 4 is controlled by an external circuit (for example, the signal processing circuit 301) of the high-frequency module 1. The first switch 4 performs switching between states of connection between the first common terminal 40 and the three first selection terminals 41 to 43 in accordance with a control signal input from, for example, the signal processing circuit 301. The first switch 4 may be configured to perform switching between the states of connection between the first common terminal 40 and the three first selection terminals 41 to 43 in accordance with a digital control signal input from, for example, the signal processing circuit 301.

(1.2.4) Second Switch

The second switch 5 has the second common terminal 50 and the three second selection terminals 51 to 53. The second common terminal 50 is connected to the first common terminal 40 of the first switch 4. In more detail, the second common terminal 50 is connected to the first common terminal 40 of the first switch 4 with the first inductor 8 interposed therebetween. The second selection terminal 51 is connected to the amplifier 61. In more detail, the second selection terminal 51 is connected to the input terminal of the amplifier 61 with the second inductor 91 interposed therebetween. The second selection terminal 52 is connected to the amplifier 62. In more detail, the second selection terminal 52 is connected to the input terminal of the amplifier 62 with the second inductor 92 interposed therebetween. The second selection terminal 53 is connected to the amplifier 63. In more detail, the second selection terminal 53 is connected to the input terminal of the amplifier 63 with the second inductor 93 interposed therebetween. The second switch 5 is, for example, a switch that allows at least one or more of the three second selection terminals 51 to 53 to be connected to the second common terminal 50. Note that the second switch 5 is, for example, a switch that allows one-to-one and one-to-many connection.

The second switch 5 is controlled by the external circuit (for example, the signal processing circuit 301) of the high-frequency module 1. The second switch 5 performs switching between states of connection between the second common terminal 50 and the three second selection terminals 51 to 53 in accordance with a control signal input from, for example, the signal processing circuit 301. The second switch 5 may be configured to perform switching between the states of connection between the second common terminal 50 and the three second selection terminals 51 to 53 in accordance with a digital control signal input from, for example, the signal processing circuit 301.

(1.2.5) Third Switch

The third switch 2 has the third common terminals 20 and the three third selection terminals 21 to 23. The third switch 2 is a switch (also referred to as an antenna switch) connected to the antenna terminal 181. The third switch 2 has the two third common terminals 20. In a case where the two third common terminals 20 are hereinafter discriminated, the two third common terminals 20 are respectively referred to as a third common terminal 20A and a third common terminal 20B on occasions. The third switch 2 has the third common terminal 20A connected to the antenna terminal 181. The antenna terminal 181 is connected to the antenna 311. The third switch 2 also has the third common terminal 20B connected to the antenna terminal 182. The antenna terminal 182 is connected to the antenna 312. The third selection terminal 21 is connected to the first terminal (input terminal) of the filter 31. The third selection terminal 22 is connected to the first terminal (input terminal) of the filter 32. The third selection terminal 23 is connected to the first terminal (input terminal) of the filter 33. The third switch 2 is a switch that allows, for example, at least one or more of the three third selection terminals 21 to 23 to be connected to the two third common terminals 20. Note that the third switch 2 is a switch that allows, for example, one-to-one and one-to-many connection to the two third common terminals 20.

The third switch 2 is controlled by the external circuit (for example, the signal processing circuit 301) of the high-frequency module 1. The third switch 2 performs switching between states of connection between each third common terminal 20 and the three third selection terminals 21 to 23 in accordance with a control signal input from, for example, the signal processing circuit 301. The third switch 2 may be configured to perform switching between the states of connection between each third common terminal 20 and the three third selection terminals 21 to 23 in accordance with a digital control signal input from, for example, the signal processing circuit 301.

(1.2.6) Fourth Switch

The fourth switch 7 has the fourth common terminal 70 and the three fourth selection terminals 71 to 73. The fourth common terminal 70 is connected to the signal output terminal 183. The signal output terminal 183 is connected to, for example, the signal processing circuit 301 included in the communication apparatus 300. The fourth selection terminal 71 is connected to the amplifier 61. In more detail, the fourth selection terminal 71 is connected to the output terminal of the amplifier 61. The fourth selection terminal 72 is connected to the amplifier 62. In more detail, the fourth selection terminal 72 is connected to the output terminal of the amplifier 62. The fourth selection terminal 73 is connected to the amplifier 63. In more detail, the fourth selection terminal 73 is connected to the output terminal of the amplifier 63. The fourth switch 7 is, for example, a switch that allows at least one or more of the three fourth selection terminals 71 to 73 to be connected to the fourth common terminal 70. Note that the fourth switch 7 is, for example, a switch that allows one-to-one and one-to-many connection.

The fourth switch 7 is controlled by the external circuit (for example, the signal processing circuit 301) of the high-frequency module 1. The fourth switch 7 performs switching between states of connection between the fourth common terminal 70 and the three fourth selection terminals 71 to 73 in accordance with a control signal input from, for example, the signal processing circuit 301. The fourth switch 7 may be configured to perform switching between the states of connection between the fourth common terminal 70 and the three fourth selection terminals 71 to 73 in accordance with a digital control signal input from, for example, the signal processing circuit 301.

(1.2.7) Signal Paths

The high-frequency module 1 has the plurality of (for example, three) signal paths r1 to r3 each of which is between a corresponding one of the plurality of (for example, three) filters 31 to 33 and a corresponding one of the plurality of (for example, three) amplifiers 61 to 63. The signal path r1 is herein a signal path between the filter 31 and the amplifier 61. In the high-frequency module 1, there are the selection terminal 41 of the first switch 4, the first common terminal 40 of the first switch 4, the second common terminal 50 of the second switch 5, and the second selection terminal 51 of the second switch 5 on the signal path r1. The signal path r2 is a signal path between the filter 32 and the amplifier 62. In the high-frequency module 1, there are the selection terminal 42 of the first switch 4, the first common terminal 40 of the first switch 4, the second common terminal 50 of the second switch 5, and the second selection terminal 52 of the second switch 5 on the signal path r2. The signal path r3 is a signal path between the filter 33 and the amplifier 63. In the high-frequency module 1, there are the selection terminal 43 of the first switch 4, the first common terminal 40 of the first switch 4, the second common terminal 50 of the second switch 5, and the second selection terminal 53 of the second switch 5 on the signal path r3.

The three signal paths r1 to r3 include the one common path r10 serving as a common signal path between the first common terminal 40 and the second common terminal 50. The three signal paths r1 to r3 also include the sections r11 to r13 different from the common path r10. The section r11 different from the common path r10 and included in the signal path r1 includes a signal path between the filter 31 and the first selection terminal 41 of the first switch 4 and a signal path between the second selection terminal 51 of the second switch 5 and the amplifier 61. The section r12 different from the common path r10 and included in the signal path r2 includes a signal path between the filter 32 and the first selection terminal 42 of the first switch 4 and a signal path between the second selection terminal 52 of the second switch 5 and the amplifier 62. The section r13 different from the common path r10 and included in the signal path r3 includes a signal path between the filter 33 and the first selection terminal 43 of the first switch 4 and a signal path between the second selection terminal 53 of the second switch 5 and the amplifier 63.

(1.2.8) First Inductor and Plurality of Second Inductors

The first inductor 8 is disposed on the common path r10 between the first common terminal 40 and the second common terminal 50, the common path r10 being included in the plurality of signal paths r1 to r3. The plurality of second inductors 91 to 93 are disposed, on a one-to-one correspondence, in the sections r11 to r13 different from the common path r10, the sections r1 to r13 being included in the plurality of respective signal paths r1 to r3.

In the high-frequency module 1, a matching circuit (input matching circuit disposed on the input terminal side of the low-noise amplifier configured as the amplifier 61) for impedance matching between the filter 31 and the amplifier 61 includes the first inductor 8 and the second inductor 91. In the high-frequency module 1, a matching circuit (an input matching circuit disposed on the input terminal side of the low-noise amplifier configured as the amplifier 62) for impedance matching between the filter 32 and the amplifier 62 includes the first inductor 8 and the second inductor 92. In the high-frequency module 1, a matching circuit (an input matching circuit disposed on the input terminal side of the low-noise amplifier configured as the amplifier 63) for impedance matching between the filter 33 and the amplifier 63 includes the first inductor 8 and the second inductor 93. In sum, in the high-frequency module 1, the one first inductor 8 is shared by the three matching circuits.

In the high-frequency module 1, the inductance of the first inductor 8 is higher than the inductances of the plurality of respective second inductors 9. The inductance of the first inductor 8 is, for example, from 10 nH to 25 nH or from 15 nH to 20 nH. The inductances of the plurality of respective second inductors 9 are each, for example, from 0.5 nH to 5 nH or from 1 nH to 3 nH. The inductances of the plurality of second inductors 9 are mutually different. For example, if the inductance of the first inductor 8 is 15 nH, the inductances of the second inductor 91, the second inductor 92, and the second inductor 93 are respectively 1 nH, and 2 nH, and 3 nH.

(1.2.9) External Connection Terminals

The high-frequency module 1 includes a plurality of external connection terminals 18. The plurality of external connection terminals 18 include the antenna terminal 181, the antenna terminal 182, the signal output terminal 183, and a plurality of ground terminals 185 (see FIG. 2A). The plurality of ground terminals 185 are terminals given the ground potential by being electrically connected to the ground electrode of the circuit substrate described above included in the communication apparatus 300.

(1.3) High-Frequency Module Structure

Hereinafter, the structure of the high-frequency module 1 will be described with reference to FIGS. 2A and 2B.

The high-frequency module 1 includes the plurality of (for example, three) filters 3, the plurality of (for example, three) amplifiers 6, the first switch 4 (see FIG. 1), the second switch 5 (see FIG. 1), the first inductor 8, the plurality of (for example, three) second inductors 9 (see FIG. 1), and the mounting substrate 13.

The mounting substrate 13 is a substrate on which a plurality of electronic components in the high-frequency module 1 are mounted. Mounting herein includes disposing an electronic component in or on the mounting substrate 13 (mechanically connecting) and electrically connecting an electronic component to (an appropriate conductor portion of) the mounting substrate 13. In the high-frequency module 1, the plurality of electronic components include the plurality of filters 3, the first inductor 8, and an integrated circuit (IC) chip 10. The IC chip 10 includes the first switch 4, the second switch 5, and the plurality of amplifiers 6. The IC chip 10 further includes the plurality of second inductors 9. In other words, the plurality of second inductors 9 are disposed within the IC chip 10. The IC chip 10 further includes the third switch 2 and the fourth switch 7.

The mounting substrate 13 has the first main surface 131 and the second main surface 132 that are opposite to each other in the depth direction D1 of the mounting substrate 13. The mounting substrate 13 is, for example, a printed-circuit board plate, a low temperature co-fired ceramics (LTCC) substrate, a high temperature co-fired ceramics (HTCC) substrate, or a multi-layer resin substrate. The mounting substrate 13 is herein, for example, a multi-layer substrate including a plurality of dielectric layers and a plurality of conductive layers. The plurality of dielectric layers and the plurality of conductive layers are stacked in the depth direction D1 of the mounting substrate 13. The plurality of conductive layers are formed in respective patterns predetermined on a layer basis. Each of the plurality of conductive layers includes one or more conductor portions on a plane orthogonal to the depth direction D1 of the mounting substrate 13. The material of each conductive layer is, for example, copper. The plurality of conductive layers include the ground layer. In the high-frequency module 1, the plurality of ground terminals 185 and the ground layer are electrically connected, with a via conductor of the mounting substrate 13 or the like interposed therebetween.

The mounting substrate 13 is not limited to a printed-circuit board plate or a LTCC substrate and may be a wiring structure. The wiring structure is, for example, a multi-layer structure. The multi-layer structure includes at least one insulating layer and at least one conductive layer. The insulating layer is formed in a predetermined pattern. If there are a plurality of insulating layers, the plurality of insulating layers are formed in respective patterns predetermined on a layer basis. The conductive layer is formed in a predetermined pattern different from the predetermined pattern of the insulating layer. If there are a plurality of conductive layers, the plurality of conductive layers are formed in respective patterns predetermined on a layer basis. The conductive layer may include one or more rewiring portions.

In the wiring structure, a first surface of two surfaces opposite to each other in the depth direction of the multi-layer structure is the first main surface 131 of the mounting substrate 13, and a second surface is the second main surface 132 of the mounting substrate 13. The wiring structure may be, for example, an interposer. The interposer may be an interposer using a silicon substrate or may be a substrate having multi-layers.

The first main surface 131 and the second main surface 132 of the mounting substrate 13 are away from each other in the depth direction D1 of the mounting substrate 13 and intersect the depth direction D1 of the mounting substrate 13. The first main surface 131 in the mounting substrate 13 is, for example, orthogonal to the depth direction D1 of the mounting substrate 13 but may include a side surface or the like of a conductor portion, for example, as a surface not orthogonal to the depth direction D1. The second main surface 132 in the mounting substrate 13 is also, for example, orthogonal to the depth direction D1 of the mounting substrate 13 but may include a side surface or the like of a conductor portion, for example, as a surface not orthogonal to the depth direction D1. In addition, the first main surface 131 and the second main surface 132 of the mounting substrate 13 may have minute unevenness, a recessed portion, or a projecting portion. The shape of the mounting substrate 13 is a rectangle in a plan view in the depth direction D1 of the mounting substrate 13 but is not limited to this. The shape may be, for example, a square.

Each of the signal paths r11 to r13 illustrated in FIG. 1 includes at least one wiring of a plurality of wirings configured as a conductor portion, a via conductor, and the like of the mounting substrate 13. For example, the signal path r11 includes a wiring connecting the filter 31 and the first selection terminal 41 of the first switch 4, a wiring connecting the first common terminal 40 of the first switch 4 and a first terminal 81 of the first inductor 8 (see FIG. 1), a wiring connecting a second terminal 82 of the first inductor 8 (see FIG. 1) and the second common terminal 50 of the second switch 5, a wiring connecting the second selection terminal 51 of the second switch 5 and the second inductor 91, and a wiring connecting the second inductor 91 and the amplifier 61. The signal path r12 includes a wiring connecting the filter 32 and the first selection terminal 42 of the first switch 4, a wiring connecting the first common terminal 40 of the first switch 4 and the first terminal 81 of the first inductor 8, a wiring connecting the second terminal 82 of the first inductor 8 and the second common terminal 50 of the second switch 5, a wiring connecting the second selection terminal 52 of the second switch 5 and the second inductor 92, and a wiring connecting the second inductor 92 and the amplifier 62. The signal path r13 includes a wiring connecting the filter 33 and the first selection terminal 43 of the first switch 4, a wiring connecting the first common terminal 40 of the first switch 4 and the first terminal 81 of the first inductor 8, a wiring connecting the second terminal 82 of the first inductor 8 and the second common terminal 50 of the second switch 5, a wiring connecting the second selection terminal 53 of the second switch 5 and the second inductor 93, and a wiring connecting the second inductor 93 and the amplifier 63.

The three filters 3 are each, for example, an electronic component as one chip. Each of the three filters 3 is, for example, a ladder filter and has a plurality of (for example, four) serial arm resonators and a plurality of (for example, three) parallel arm resonators. Each of the three filters 3 is, for example, an acoustic wave filter, and each of the plurality of serial arm resonators and the plurality of parallel arm resonators is configured as an acoustic wave resonator. The acoustic wave filter is, for example, a surface acoustic wave filter using a surface acoustic wave.

In the surface acoustic wave filter, the plurality of serial arm resonators and the plurality of parallel arm resonators are each, for example, a surface acoustic wave (SAW) resonator.

Each of the three filters 3 has, for example, a substrate having a first main surface and a second main surface and a circuit portion formed on the first main surface side of the substrate and serving as a reception filter. The substrate is, for example, a piezoelectric substrate. The piezoelectric substrate is, for example, a lithium tantalite substrate or a lithium niobate substrate. The circuit portion has a plurality of interdigital transducer (IDT) electrodes for the plurality of respective serial arm resonators and a plurality of IDT electrodes for the plurality of respective parallel arm resonators.

As illustrated in FIG. 2A, the three filters 3 are mounted on the first main surface 131 of the mounting substrate 13. The three filters 3 are thus located on the first main surface 131 of the mounting substrate 13. In the plan view in the depth direction D1 of the mounting substrate 13, the three filters 3 each has a square outline.

In each of the three filters 3, the substrate is not limited to a piezoelectric substrate and may be, for example, a silicon substrate. In this case, each of the three filters 3 has a low-acoustic-velocity film disposed on the first main surface of the substrate and a piezoelectric layer disposed on the low-acoustic-velocity film. The plurality of IDT electrodes are disposed on the piezoelectric layer. The low-acoustic-velocity film is disposed on the substrate directly or indirectly. The piezoelectric layer is disposed on the low-acoustic-velocity film directly or indirectly. In the low-acoustic-velocity film, the acoustic velocity of the bulk wave propagating through the low-acoustic-velocity film is lower than the acoustic velocity of the bulk wave propagating through the piezoelectric layer. The material of the piezoelectric layer is, for example, lithium tantalate. The material of the low-acoustic-velocity film is, for example, silicon oxide. If the wavelength of an acoustic wave determined by the electrode finger period of the IDT electrodes is λ, the depth of the piezoelectric layer is, for example, lower than or equal to 3.5λ. The depth of the low-acoustic-velocity film is, for example, lower than or equal to 2.0λ.

The piezoelectric layer may be formed from, for example, one of lithium tantalate, lithium niobate, zinc oxide, aluminum nitride, and PZT. The low-acoustic-velocity film may include at least one type of material selected from the group consisting of silicon oxide, glass, silicon oxynitride, tantalum pentoxide, and a compound formed by adding fluorine, carbon, or boron to silicon oxide. In addition, the substrate may include at least one type of material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

Each of the three filters 3 may include, for example, a close-contact layer interposed between the low-acoustic-velocity film and the piezoelectric layer. The close-contact layer is formed from, for example, a resin (an epoxy resin or a polyimide resin). Each of the three filters 3 may also include a dielectric film between the low-acoustic-velocity film and the piezoelectric layer, on the piezoelectric layer, or under the low-acoustic-velocity film.

Each of the three filters 3 may also include, for example, a high-acoustic-velocity film interposed between the substrate and the low-acoustic-velocity film. The high-acoustic-velocity film is herein disposed on the substrate directly or indirectly. The low-acoustic-velocity film is disposed on the high-acoustic-velocity film directly or indirectly. The piezoelectric layer is disposed on the low-acoustic-velocity film directly or indirectly. In the high-acoustic-velocity film, the acoustic velocity of the bulk wave propagating through the high-acoustic-velocity film is higher than the acoustic velocity of the acoustic wave propagating through the piezoelectric layer. In the low-acoustic-velocity film, the acoustic velocity of the bulk wave propagating through the low-acoustic-velocity film is lower than the acoustic velocity of the bulk wave propagating through the piezoelectric layer.

The high-acoustic-velocity film is formed from: a piezoelectric body, such as diamondlike carbon, aluminum nitride, aluminum oxide, silicon carbide, silicon nitride, silicon, sapphire, lithium tantalate, lithium niobate, or crystal; any of various ceramics, such as alumina, zirconia, cordierite, mullite, steatite, and forsterite; magnesia; diamond; a material having any of the materials described above serving as a main component; or a material having a mixture of the materials described above serving as a main component.

Each of the three filters 3 may further have, for example, a spacer layer and a cover member. The spacer layer and the cover member are disposed on the first main surface side of the substrate. The spacer layer surrounds the plurality of IDT electrodes in the plan view in the depth direction D1 of the mounting substrate 13. The material of the spacer layer is, for example, a synthetic resin such as an epoxy resin or polyimide. The cover member is located on the spacer layer in such a manner as to face the substrate in the depth direction D1 of the mounting substrate 13. The material of the cover member is, for example, a synthetic resin such as an epoxy resin or polyimide. The three filters 3 each has a space surrounded by the substrate, the spacer layer, and the cover member. If the three filters 3 each has the cover member, the three filters 3 each has a plurality of terminals exposed from the cover member.

The first inductor 8 is a surface mount inductor and is mounted on the first main surface 131 of the mounting substrate 13. The first inductor 8 is thus located on the first main surface 131 of the mounting substrate 13. As the surface mount inductor, for example, a coil inductor having a conductor wound around a nonmagnetic core for forming a coil may be employed. The first inductor 8 is a surface mount inductor as described above and has the first terminal 81 (see FIG. 1) and the second terminal 82 (see FIG. 1). In the high-frequency module 1, the first common terminal 40 of the first switch 4 is connected to the first terminal 81 of the first inductor 8, and the second common terminal 50 of the second switch 5 is connected to the second terminal 82. In the plan view in the depth direction D1 of the mounting substrate 13, the first inductor 8 has a square outline.

As described above, the IC chip 10 includes the first switch 4, the second switch 5, the plurality of amplifiers 6, the plurality of second inductors 9, the third switch 2, and the fourth switch 7. The first switch 4 includes the first common terminal 40, the three first selection terminals 41 to 43, and a plurality of field effect transistors (FETs). The second switch 5 includes the second common terminal 50, the three second selection terminals 51 to 53, and a plurality of FETs. The third switch 2 includes the third common terminals 20, the three third selection terminals 21 to 23, and a plurality of FETs. The fourth switch 7 includes the fourth common terminal 70, the three fourth selection terminals 71 to 73, and a plurality of FETs. The plurality of second inductors 9 are, for example, a flat coil.

The IC chip 10 is a semiconductor chip as one chip on which the first switch 4, the second switch 5, the plurality of amplifiers 6, the plurality of second inductors 9, the third switch 2, and the fourth switch 7 are integrated. In more detail, the IC chip 10 includes a substrate having a first main surface and a second main surface that are opposite to each other, and the first switch 4, the second switch 5, the third switch 2, the fourth switch 7, the plurality of amplifiers 6, and the plurality of second inductors 9 are formed on the first main surface side of the substrate. The substrate is, for example, a silicon substrate. Each of the second inductors 9 is herein composed of a conductor portion in a predetermined pattern disposed in the insulating layer on the first main surface of the substrate. The IC chip 10 is mounted on the second main surface 132 of the mounting substrate 13 to cause the first main surface of the substrate out of the first main surface and the second main surface to face the second main surface 132 of the mounting substrate 13. In the plan view in the depth direction D1 of the mounting substrate 13, the IC chip 10 has a square outline.

The plurality of external connection terminals 18 are located on the second main surface 132 of the mounting substrate 13. The material of the plurality of external connection terminals 18 is, for example, a metal (for example, copper or a copper alloy). The plurality of external connection terminals 18 are each a columnar electrode. The columnar electrode is herein, for example, a pillar-shaped electrode. The plurality of external connection terminals 18 are of the same shape but may be of different shapes.

As described above, the plurality of external connection terminals 18 include the antenna terminal 181, the antenna terminal 182, the signal output terminal 183, and the plurality of ground terminals 185. The plurality of external connection terminals 18 also include a control terminal 186 (see FIG. 2A) for receiving a digital control signal from the signal processing circuit 301 to the IC chip 10. The control terminal 186 is connected to, for example, the IC chip 10. The IC chip 10 herein includes a controller unit that controls the first switch 4, the second switch 5, the third switch 2, the fourth switch 7, and other components in accordance with a control signal input from the signal processing circuit 301 through the control terminal 186. The controller unit also controls the plurality of amplifiers 6. As described above, the ground terminals 185 are electrically connected to the ground layer of the mounting substrate 13. The ground layer is the circuit ground of the high-frequency module 1.

The high-frequency module 1 further includes a first resin layer 14. The first resin layer 14 is disposed on the first main surface 131 of the mounting substrate 13. The first resin layer 14 covers the plurality of electronic components mounted on the first main surface 131 of the mounting substrate 13. The plurality of electronic components herein include the plurality of filters 3 and the first inductor 8. The first resin layer 14 includes a resin. The first resin layer 14 may include a filler in addition to the resin.

The high-frequency module 1 further includes a second resin layer 15. The second resin layer 15 is disposed on the second main surface 132 of the mounting substrate 13. The second resin layer 15 covers electronic components mounted on the second main surface 132 of the mounting substrate 13 and part of each of the plurality of external connection terminals 18. The electronic components herein include the IC chip 10. The second resin layer 15 is formed to expose a top surface of each of the plurality of external connection terminals 18. The second resin layer 15 includes a resin. The second resin layer 15 may include a filler in addition to the resin. The material of the second resin layer 15 may be the same material as or a different material from the material of the first resin layer 14. The second resin layer 15 may be disposed to expose the second main surface of the substrate in the IC chip 10.

The high-frequency module 1 further includes a shield layer 16. The material of the shield layer 16 is, for example, a metal. The shield layer 16 covers a main surface 141 and an outer side-surrounding surface 143 of the first resin layer 14, an outer side-surrounding surface 133 of the mounting substrate 13, and an outer side-surrounding surface 153 of the second resin layer 15. The shield layer 16 is in contact with the ground layer of the mounting substrate 13. In the high-frequency module 1, the potential of the shield layer 16 can thereby be made equal to the potential of the ground layer.

In the high-frequency module 1, the plurality of filters 3 and the first inductor 8 overlap with the IC chip 10 in the plan view in the depth direction D1 of the mounting substrate 13.

(3) Summarization (3.1) High-Frequency Module

The high-frequency module 1 according to Embodiment 1 includes the plurality of filters 31 to 33, the plurality of amplifiers 61 to 63, the first switch 4, the second switch 5, the first inductor 8, the plurality of second inductors 91 to 93, and the mounting substrate 13. The plurality of filters 31 to 33 are connectable to the antenna terminal 181. The first switch 4 has the first common terminal 40 and the plurality of first selection terminals 41 to 43. The first switch 4 has the plurality of first selection terminals 41 to 43 to which the plurality of filters 31 to 33 are respectively connected. The second switch 5 has the second common terminal 50 and the plurality of second selection terminals 51 to 53. The second switch 5 has the plurality of second selection terminals 51 to 53 to which the plurality of amplifiers 61 to 63 are respectively connected. The first inductor 8 is disposed on the common path r10 between the first common terminal 40 and the second common terminal 50, the common path r10 being included in the plurality of signal paths r1 to r3 each of which is between a corresponding one of the plurality of filters 31 to 33 and a corresponding one of the plurality of amplifiers 61 to 63. The plurality of second inductors 91 to 93 are disposed, on a one-to-one correspondence, in the sections r11 to r13 different from the common path r10, the sections r11 to r13 being included in the plurality of respective signal paths r1 to r3. The mounting substrate 13 has the first main surface 131 and the second main surface 132 that are opposite to each other. The first inductor 8 is a surface mount inductor located on the first main surface 131 of the mounting substrate 13. The plurality of second inductors 91 to 93 are each an inductor disposed within the IC chip 10 including the plurality of amplifiers 61 to 63.

The high-frequency module 1 according to Embodiment 1 enables downsizing. In more detail, in the high-frequency module 1 according to Embodiment 1, the first inductor 8 that is a surface mount inductor is disposed on the common path r10 included in the signal paths r1 to r3 each of which is between a corresponding one of the plurality of filters 31 to 33 and a corresponding one of the plurality of amplifiers 61 to 63, and thus downsizing in an outer size viewed in the depth direction D1 of the mounting substrate 13 is enabled as compared with the case where the plurality of matching circuits (input matching circuits) for the plurality of amplifiers 61 to 63 on a one-to-one correspondence include mutually different surface mount inductors.

Since the first inductor 8 is a surface mount inductor in the high-frequency module 1 according to Embodiment 1, the inductance of the first inductor 8 disposed on the common path r10 and the Q value may be made higher. In the high-frequency module 1 according to Embodiment 1, the inductances of the plurality of respective second inductors 9 disposed within the IC chip 10 may thereby be made lower than the inductance of the first inductor 8. Thus, in the high-frequency module 1 according to Embodiment 1, the area occupied by the plurality of second inductors 9 in the IC chip 10 and viewed in the depth direction D1 of the mounting substrate 13 may be reduced, and thus the high-frequency module 1 according to Embodiment 1 enables downsizing.

(3.2) Communication Apparatus

The communication apparatus 300 according to Embodiment 1 includes the high-frequency module 1 and the signal processing circuit 301. The signal processing circuit 301 is connected to the high-frequency module 1. The signal processing circuit 301 performs signal processing of a high-frequency signal.

The communication apparatus 300 according to Embodiment 1 includes the high-frequency module 1 and thus enables downsizing. A plurality of electronic components constituting the signal processing circuit 301 may be mounted, for example, on the circuit substrate described above or may be mounted on a circuit substrate (a second circuit substrate) different from the circuit substrate (a first circuit substrate) having the high-frequency module 1 mounted thereon.

(4) Modification of High-Frequency Module

Figure 3:
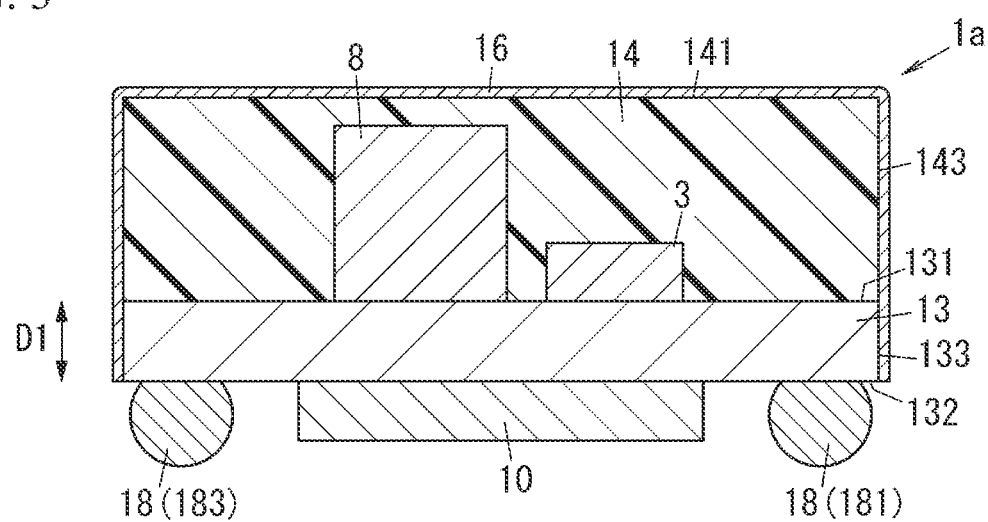
FIG. 3 is a cross-sectional view of a high-frequency module according to a modification of Embodiment 1.

A high-frequency module 1a according to a modification of Embodiment 1 will be described with reference to FIG. 3. Regarding the high-frequency module 1a according to the modification, the same components as those of the high-frequency module 1 according to Embodiment 1 are denoted by the same reference numerals, and description thereof is omitted.

The high-frequency module 1a according to the modification is different from the high-frequency module 1 according to Embodiment 1 in that the plurality of external connection terminals 18 are ball bumps. In addition, the high-frequency module 1a according to the modification is different from the high-frequency module 1 according to Embodiment 1 in that the second resin layer 15 of the high-frequency module 1 according to Embodiment 1 is not included. The high-frequency module 1a according to the modification may include an underfill portion disposed in a gap between the second main surface 132 of the mounting substrate 13 and the IC chip 10 subjected to flip-chip mounting on the second main surface 132 of the mounting substrate 13.

The material of the ball bumps formed as the plurality of external connection terminals 18 is, for example, gold, copper, or solder.

The plurality of external connection terminals 18 may include the external connection terminals 18 formed as the ball bumps and the external connection terminals 18 formed as the columnar electrodes.

The high-frequency module 1a according to the modification enables downsizing, like the high-frequency module 1 according to Embodiment 1.

Embodiment 2

Figure 4:
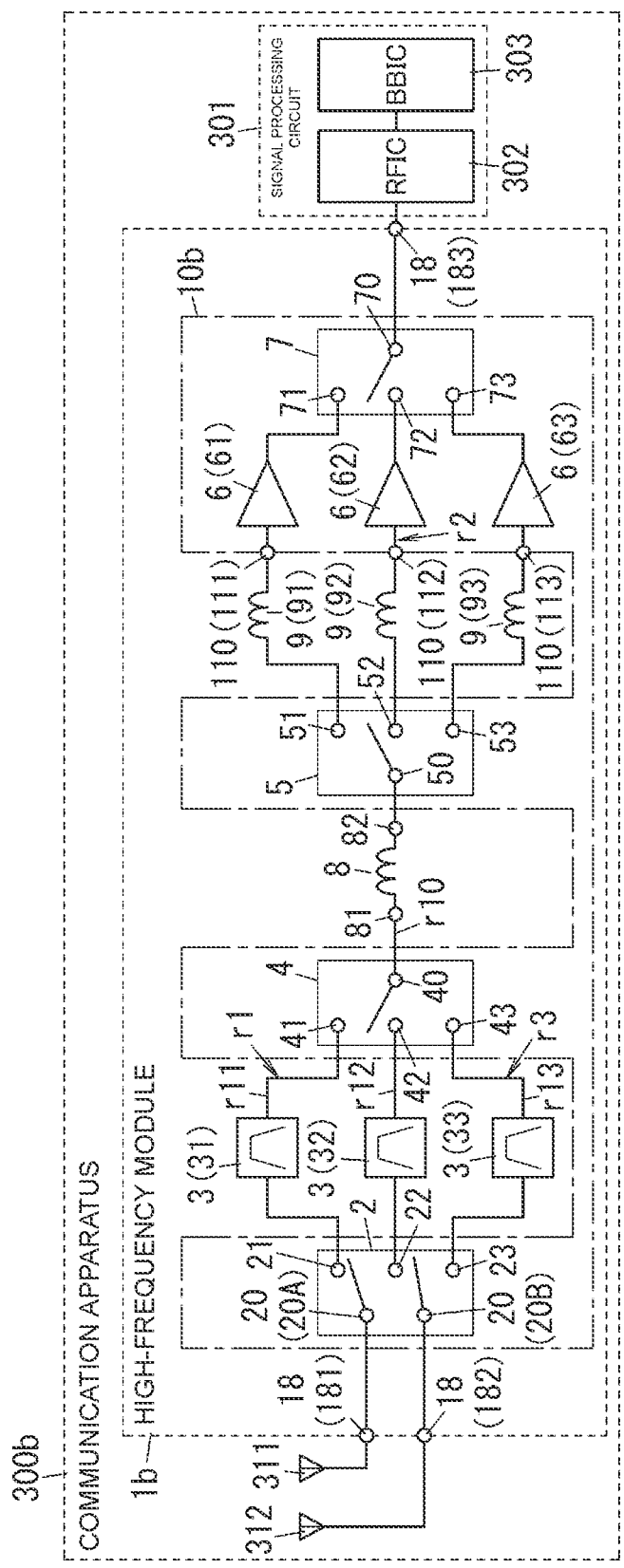
FIG. 4 is a circuit diagram of a high-frequency module according to Embodiment 2 and a communication apparatus including the same.
Figure 5:
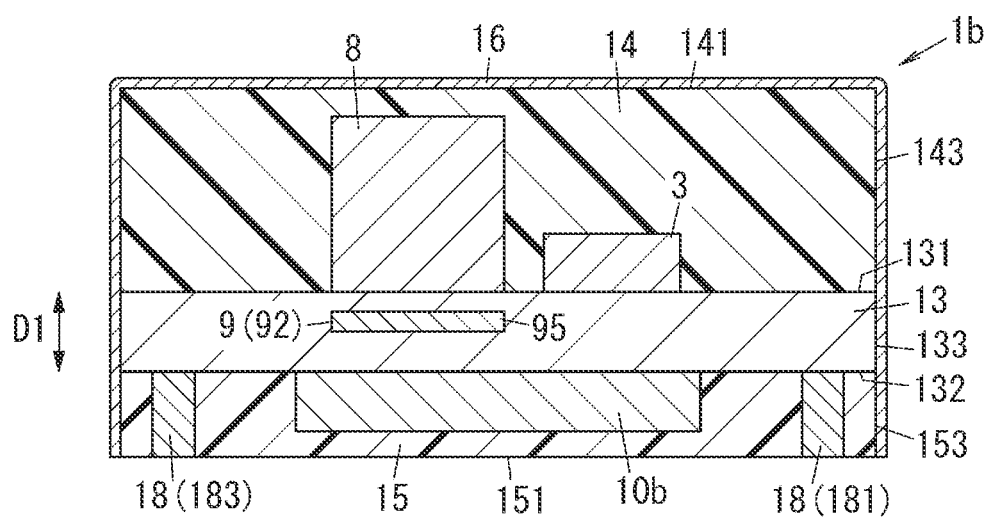
FIG. 5 is a cross-sectional view of the high-frequency module as above.

A high-frequency module 1b and a communication apparatus 300b according to Embodiment 2 will be described with reference to FIGS. 4 and 5. Regarding the high-frequency module 1*b* and the communication apparatus 300*b* according to Embodiment 2, the same components as those of the high-frequency module 1 and the communication apparatus 300 according to Embodiment 1 are denoted by the same reference numerals, and description thereof is omitted.

The high-frequency module 1*b* according to Embodiment 2 is different from the high-frequency module 1 according to Embodiment 1 in that the plurality of second inductors 9 are inductors including respective conductive patterns 95 formed in the mounting substrate 13. The plurality of second inductors 9 may each include not only a corresponding one of the conductive patterns 95 but also a via conductor or the two or more conductive patterns 95. Each of the plurality of second inductors 9 herein includes the corresponding two or more conductive patterns 95 located away from each other in the depth direction D1 of the mounting substrate 13 and a via conductor connecting the conductive patterns 95 adjacent to each other in the depth direction D1 of the mounting substrate 13.

In the high-frequency module 1*b*, like the high-frequency module 1 according to Embodiment 1, the inductance of the first inductor 8 is higher than the inductances of the plurality of respective second inductors 9. The inductance of the first inductor 8 is, for example, from 10 nH to 25 nH or from 15 nH to 20 nH. The inductances of the plurality of respective second inductors 9 are each, for example, from 0.5 nH to 5 nH and or from 1 nH to 3 nH. The inductances of the plurality of respective second inductors 9 are mutually different. For example, if the inductance of the first inductor 8 is 15 nH, the inductances of the second inductor 91, the second inductor 92, and the second inductor 93 are respectively 1 nH, 2 nH, and 3 nH.

The high-frequency module 1*b* according to Embodiment 2 is also different in that the high-frequency module 1*b* includes an IC chip 10*b* instead of the IC chip 10 in the high-frequency module 1 according to Embodiment 1.

The IC chip 10*b* includes the plurality of (for example, three) amplifiers 6, the first switch 4, the second switch 5, the third switch 2, and the fourth switch 7 but does not include the plurality of (for example, three) second inductors 9. In addition, the IC chip 10*b* has a plurality of terminals 110 (see FIG. 4) connected, on a one-to-one correspondence, to the plurality of (three) second inductors 9 separated from the IC chip 10*b*. The plurality of terminals 110 of the IC chip 10*b* herein include a terminal 111 to which the second inductor 91 is connected, a terminal 112 to which the second inductor 92 is connected, and a terminal 113 to which the second inductor 93 is connected. The second inductor 91 has a first end and a second end. The first end of the second inductor 91 is connected to the second selection terminal 51 of the second switch 5, and the second end thereof is connected to the terminal 111 of the IC chip 10*b*. The second inductor 92 has a first end and a second end. The first end of the second inductor 92 is connected to the second selection terminal 52 of the second switch 5, and the second end thereof is connected to the terminal 112 of the IC chip 10*b*. The second inductor 93 has a first end and a second end. The first end of the second inductor 93 is connected to the second selection terminal 53 of the second switch 5, and the second end thereof is connected to the terminal 113 of the IC chip 10*b*.

The high-frequency module 1*b* according to Embodiment 2 includes the plurality of filters 31 to 33, the plurality of amplifiers 61 to 63, the first switch 4, the second switch 5, the first inductor 8, the plurality of second inductors 91 to 93, and the mounting substrate 13. The plurality of filters 31 to 33 are connectable to the antenna terminal 181. The first switch 4 has the first common terminal 40 and the plurality of first selection terminals 41 to 43. The first switch 4 has the plurality of first selection terminals 41 to 43 to which the plurality of filters 31 to 33 are respectively connected. The second switch 5 has the second common terminal 50 and the plurality of second selection terminals 51 to 53. The second switch 5 has the plurality of second selection terminals 51 to 53 to which the plurality of amplifiers 61 to 63 are respectively connected. The first inductor 8 is disposed on the common path r10 between the first common terminal 40 and the second common terminal 50, the common path r10 being included in the plurality of signal paths r1 to r3 each of which is between a corresponding one of the plurality of filters 31 to 33 and a corresponding one of the plurality of amplifiers 61 to 63. The plurality of second inductors 91 to 93 are disposed, on a one-to-one correspondence, in the sections r11 to r13 different from the common path r10, the sections r11 to r13 being included in the plurality of respective signal paths r1 to r3. The mounting substrate 13 has the first main surface 131 and the second main surface 132 that are opposite to each other. The first inductor 8 is a surface mount inductor located on the first main surface 131 of the mounting substrate 13. The plurality of second inductors 9 are each an inductor including the one or more conductive patterns 95 formed in the mounting substrate 13.

The high-frequency module 1*b* according to Embodiment 2 enables downsizing. In more detail, in the high-frequency module 1*b* according to Embodiment 2, the first inductor 8 as a surface mount inductor is disposed on the common path r10 included in the signal paths r1 to r3 each of which is between a corresponding one of the plurality of filters 31 to 33 and a corresponding one of the plurality of amplifiers 61 to 63, and thus downsizing is enabled as compared with the case where the plurality of matching circuits (input matching circuits) for the plurality of amplifiers 61 to 63 on a one-to-one correspondence include mutually different surface mount inductors.

In the high-frequency module 1*b* according to Embodiment 2, the first inductor 8 is a surface mount inductor, and thus the inductance and the Q value of the first inductor 8 disposed on the common path r10 may be made higher. In the high-frequency module 1*b* according to Embodiment 2, the inductances of the plurality of respective second inductors 9 formed on the mounting substrate 13 may thereby be made lower than the inductance of the first inductor 8. The high-frequency module 1*b* according to Embodiment 2 thus enables downsizing. The conductive patterns 95 of the plurality of second inductors 9 are formed in the mounting substrate 13.

The communication apparatus 300*b* according to Embodiment 2 includes the high-frequency module 1*b* and thus enables downsizing.

Embodiment 3

Figure 6:
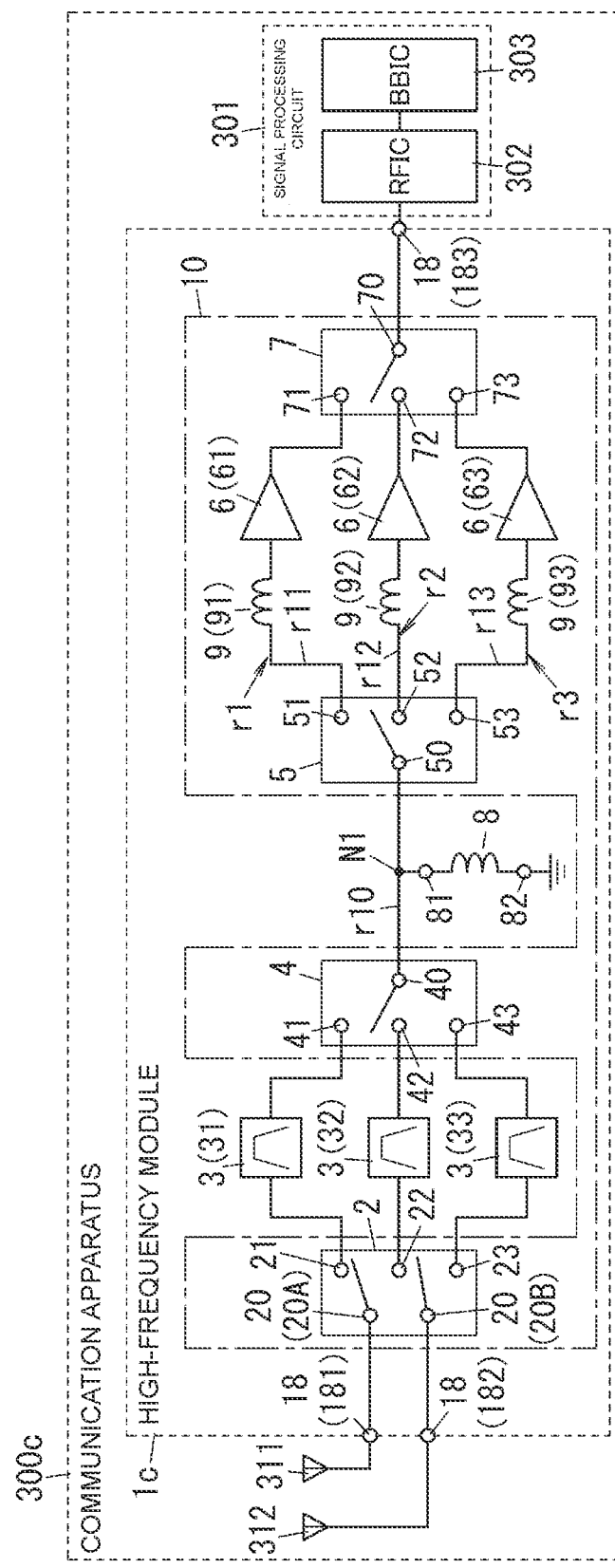
FIG. 6 is a circuit diagram of a high-frequency module according to Embodiment 3 and a communication apparatus including the same.

A high-frequency module 1*c* and a communication apparatus 300*c* according to Embodiment 3 will be described with reference to FIG. 6. Regarding the high-frequency module 1*c* and the communication apparatus 300*c* according to Embodiment 3, the same components as those of the high-frequency module 1 and the communication apparatus 300 according to Embodiment 1 are denoted by the same reference numerals, and description thereof is omitted.

For the high-frequency module 1*c* according to Embodiment 3, the predetermined frequency band includes, for example, mid-band and high-band. In other words, the high-frequency module 1c according to Embodiment 3 is a high-frequency module that can support mid-band and high-band. Mid-band includes, for example, Band 1, Band 3, Band 4, Band 11, Band 25, Band 70, Band 34, and Band 39. Band 34 and Band 39 are communication bands used for communication supporting time division duplex (TDD) as a communication system. High-band includes, for example, Band 7, Band 30, Band 40, Band 41, Band 53, n75, and n76. The communication standard for the communication bands included in the predetermined frequency band is, for example, the LTE standard or the 5G NR standard.

The high-frequency module 1c according to Embodiment 3 is different from the high-frequency module 1 according to Embodiment 1 in that regarding the first inductor 8 disposed on the common path r10, the first terminal 81 is connected to a node N1 of the common path r10 and in that the second terminal 82 is connected to the ground.

Like the high-frequency module 1 according to Embodiment 1, in the high-frequency module 1c, the inductance of the first inductor 8 is higher than the inductances of the plurality of respective second inductors 9. The inductance of the first inductor 8 is, for example, from 5 nH to 15 nH. The inductances of the plurality of respective second inductors 9 are each, for example, from 0.5 nH to 5 nH. The inductances of the plurality of respective second inductors 9 are mutually different. For example, if the inductance of the first inductor 8 is 15 nH, the inductances of the second inductor 91, the second inductor 92, and the second inductor 93 are respectively 1 nH, 2 nH, and 3 nH.

Like the high-frequency module 1 according to Embodiment 1, the high-frequency module 1c according to Embodiment 3 includes the plurality of filters 31 to 33, the plurality of amplifiers 61 to 63, the first switch 4, the second switch 5, the first inductor 8, the plurality of second inductors 91 to 93, and the mounting substrate 13 (see FIGS. 2A and 2B). The plurality of filters 31 to 33 are connectable to the antenna terminal 181. The first switch 4 has the first common terminal 40 and the plurality of first selection terminals 41 to 43. The first switch 4 has the plurality of first selection terminals 41 to 43 to which the plurality of filters 31 to 33 are respectively connected. The second switch 5 has the second common terminal 50 and the plurality of second selection terminals 51 to 53. The second switch 5 has the plurality of second selection terminals 51 to 53 to which the plurality of amplifiers 61 to 63 are respectively connected. The first inductor 8 is disposed on the common path r10 between the first common terminal 40 and the second common terminal 50, the common path r10 being included in the plurality of signal paths r1 to r3 each of which is between a corresponding one of the plurality of filters 31 to 33 and a corresponding one of the plurality of amplifiers 61 to 63. The plurality of second inductors 91 to 93 are disposed, on a one-to-one correspondence, in the sections r1 to r13 different from the common path r10, the sections r1 to r13 being included in the plurality of respective signal paths r1 to r3. The mounting substrate 13 has the first main surface 131 and the second main surface 132 that are opposite to each other. The first inductor 8 is a surface mount inductor located on the first main surface 131 of the mounting substrate 13. The plurality of second inductors 91 to 93 are inductors disposed within the IC chip 10 including the plurality of amplifiers 61 to 63. Like the high-frequency module 1 according to Embodiment 1, the high-frequency module 1c according to Embodiment 3 thus enables downsizing.

The communication apparatus 300c according to Embodiment 3 includes the high-frequency module 1c thus enables downsizing.

Embodiment 4

Figure 7:
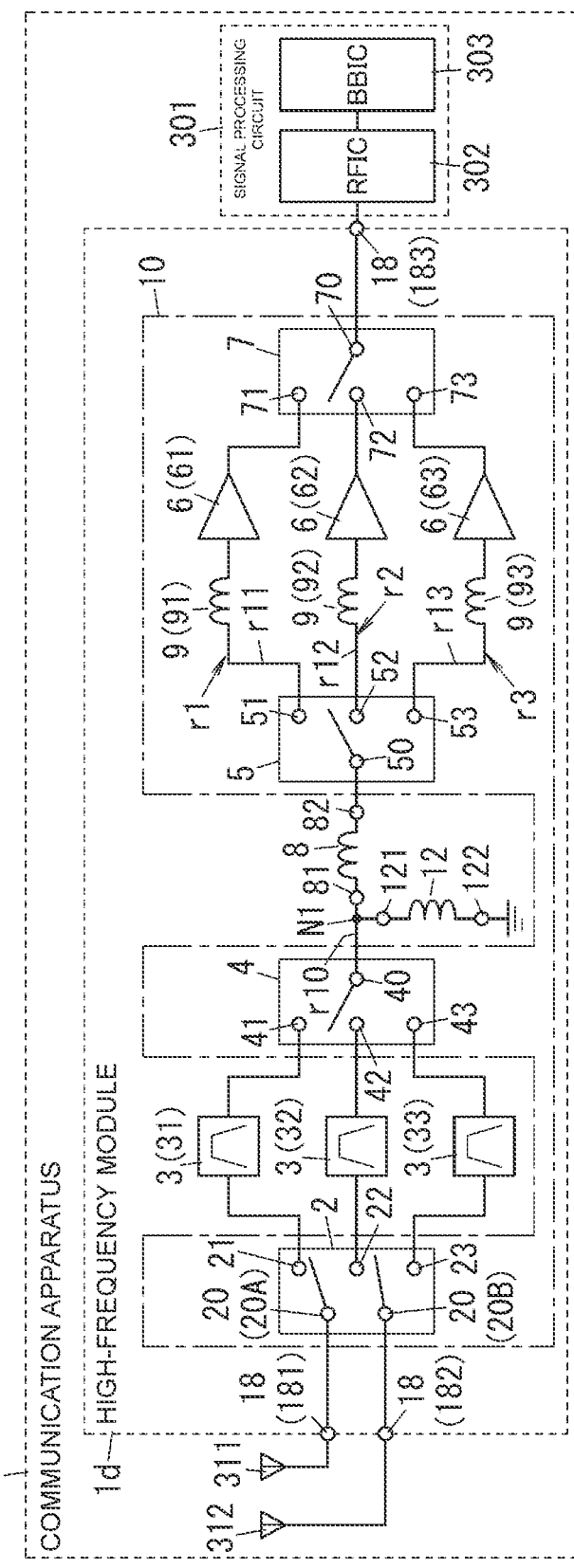
FIG. 7 is a circuit diagram of a high-frequency module according to Embodiment 4 and a communication apparatus including the same.
Figure 8A:
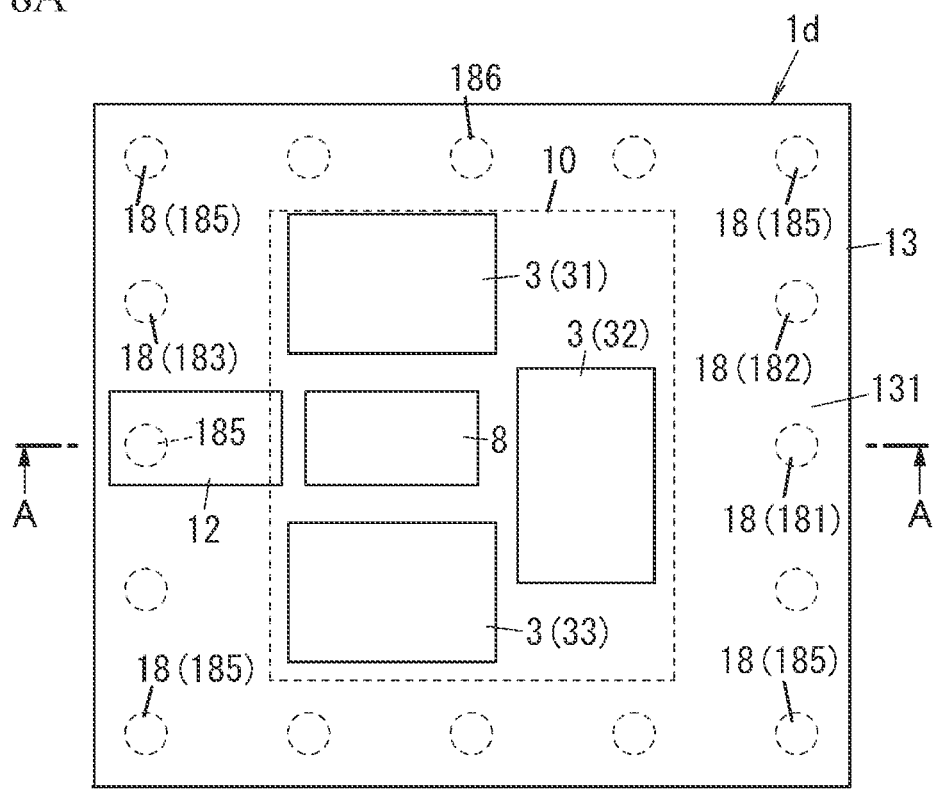
FIG. 8A is a plan view of the high-frequency module as above.
Figure 8B:
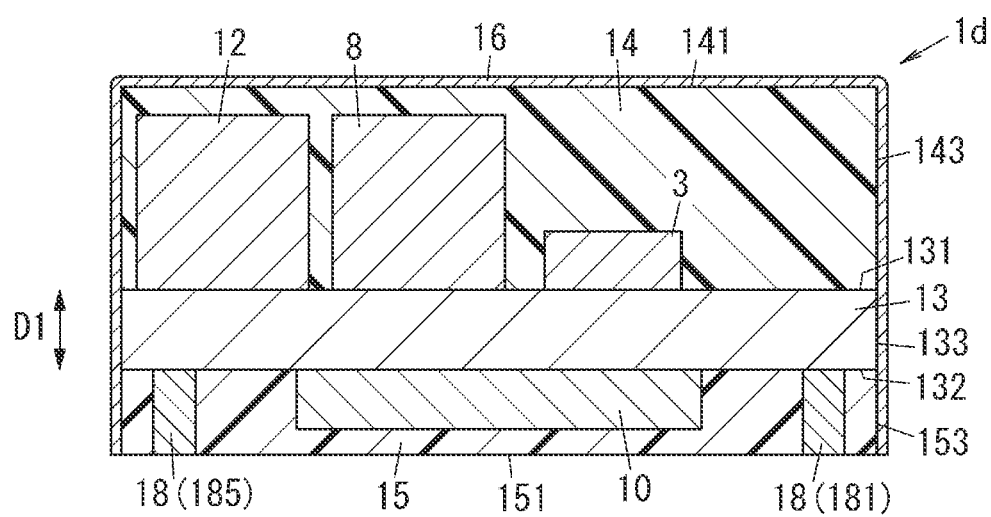
FIG. 8B illustrates the high-frequency module as above and is a cross-sectional view taken along the A-A line in FIG. 8A.

A high-frequency module 1d and a communication apparatus 300d according to Embodiment 4 will be described with reference to FIGS. 7, 8A, and 8B. Regarding the high-frequency module 1d and the communication apparatus 300d according to Embodiment 4, the same components as those of the high-frequency module 1 and the communication apparatus 300 according to Embodiment 1 are denoted by the same reference numerals, and description thereof is omitted.

For the high-frequency module 1d according to Embodiment 4, the predetermined frequency band includes, for example, low-band, mid-band, and high-band. In other words, the high-frequency module 1d according to Embodiment 4 is a high-frequency module that can support low-band, mid-band, and high-band. Low-band includes Band 71, Band 28A, Band 28B, Band 12, Band 13, Band 14, Band 20, Band 26, and Band 8. Mid-band includes, for example, Band 1, Band 3, Band 4, Band 11, Band 25, Band 70, Band 34, and Band 39. High-band includes, for example, Band 7, Band 30, Band 40, Band 41, Band 53, n75, and n76. The communication standard for the communication bands included in the predetermined frequency band is, for example, the LTE standard or the 5G NR standard. Band 34, Band 39, Band 40, Band 41, and Band 42 are the communication bands used for communication that supports time division duplex (TDD) as a communication system. The high-frequency module 1d can support both of frequency division duplex (FDD) and TDD as the communication system because the third switch 2 has the two third common terminals 20A and 20B.

The high-frequency module 1d according to Embodiment 4 is different from the high-frequency module 1 according to Embodiment 1 in that the high-frequency module 1d further includes a third inductor 12.

The third inductor 12 is disposed between the common path r10 and the ground (ground terminals 185). The third inductor 12 is a surface mount inductor located on the first main surface 131 of the mounting substrate 13. The third inductor 12 has a first terminal 121 and a second terminal 122. Regarding the third inductor 12, the first terminal 121 is connected, on the common path r10, to the node N1 between the first common terminal 40 of the first switch 4 and the first inductor 8, and the second terminal 122 is connected to the ground (in FIGS. 8A and 8B, the ground terminals 185 overlapping with the third inductor 12 in the depth direction D1 of the mounting substrate 13).

In the high-frequency module 1d, a matching circuit for impedance matching between the filter 31 and the amplifier 61 includes the first inductor 8, the second inductor 91, and the third inductor 12. In the high-frequency module 1d, a matching circuit for impedance matching between the filter 32 and the amplifier 62 includes the first inductor 8, the second inductor 92, and the third inductor 12. In the high-frequency module 1d, a matching circuit for impedance matching between the filter 33 and the amplifier 63 includes the first inductor 8, the second inductor 93, and the third inductor 12. In sum, in the high-frequency module 1d, the one first inductor 8 and the one third inductor 12 are shared by the three matching circuits.

Like the high-frequency module 1 according to Embodiment 1, in the high-frequency module 1d, the inductance of the first inductor 8 is higher than the inductances of the plurality of respective second inductors 9. The inductance of the third inductor 12 is also higher than the inductances of the plurality of respective second inductors 9. The inductance of the first inductor 8 is, for example, from 5 nH to 15 nH. The inductances of the plurality of respective second inductors 9 are each, for example, from 0.5 nH to 2 nH. The inductances of the plurality of respective second inductors 9 are mutually different. The inductance of the third inductor 12 is, for example, from 5 nH to 15 nH.

Like the high-frequency module 1 according to Embodiment 1, in the high-frequency module 1*d* according to Embodiment 4, the first inductor 8 is a surface mount inductor located on the first main surface 131 of the mounting substrate 13. The plurality of second inductors 91 to 93 are inductors disposed within the IC chip 10 including the plurality of amplifiers 61 to 63. The high-frequency module 1*d* according to Embodiment 4 enables downsizing, like the high-frequency module 1 according to Embodiment 1.

The high-frequency module 1*d* according to Embodiment 4 includes the third inductor 12, thereby may support communication in a wider predetermined frequency band than for the high-frequency module 1 according to Embodiment 1, and thus may support low-band, mid-band, and high-band.

The high-frequency module 1*d* according to Embodiment 4 includes the third inductor 12 serving as a shunt inductor between the input terminal of the amplifiers 6 serving as the low-noise amplifier and the filters 3 and may thus shorten switching time for the controller unit that controls the amplifiers 6 to turn on the amplifiers 6.

The communication apparatus 300*d* according to Embodiment 4 includes the high-frequency module 1*d* and thus enables downsizing.

Other Modifications

Each of Embodiments 1 to 4 above is merely one of various embodiments of the present disclosure. Various changes may be made to Embodiments 1 to 4.

For example, in the high-frequency modules 1, 1*a*, 1*b*, 1*c*, and 1*d*, the number of first selection terminals of the first switch 4 may be different from the number of filters 3 connected to the first switch 4. In the high-frequency modules 1, 1*a*, 1*b*, 1*c*, and 1*d*, the number of second selection terminals of the second switch 5 may also be different from the number of amplifiers 6 connected to the second switch 5. In the high-frequency modules 1, 1*a*, 1*b*, 1*c*, and 1*d*, the number of third selection terminals of the third switch 2 may also be different from the number of filters 3 connected to the third switch 2. In the high-frequency modules 1, 1*a*, 1*b*, 1*c*, and 1*d*, the number of fourth selection terminals of the fourth switch 7 may also be different from the number of amplifiers 6 connected to the fourth switch 7.

In addition, the mounting substrate 13 may be a substrate having built-in components.

In addition, it suffices that in the high-frequency modules 1, 1*a*, 1*c*, and 1*d*, the IC chip 10 includes at least the plurality of amplifiers 6 and the plurality of second inductors 9, and it is optional to include the first switch 4, the second switch 5, the third switch 2, and the fourth switch 7. For example, the high-frequency module 1 may have an IC chip including the first switch 4, the second switch 5, the third switch 2, and the fourth switch 7, separately from the IC chip 10 and may have four switch integrated circuits (ICs) respectively configured as the first switch 4, the second switch 5, the third switch 2, and the fourth switch 7. In addition, in the high-frequency module 1*b* according to Embodiment 2, it suffices that the IC chip 10*b* includes at least the plurality of amplifiers 6, and it is optional to include the first switch 4, the second switch 5, the third switch 2, and the fourth switch 7. In addition, the location of the IC chips 10 and 10*b* is not limited to the second main surface 132 of the mounting substrate 13, and the IC chips 10 and 10*b* may be located on the first main surface 131 of the mounting substrate 13.

In addition, the plurality of filters 3 are each an acoustic wave filter using a surface acoustic wave but is not limited to this and may be, for example, an acoustic wave filter using a boundary acoustic wave, a plate wave, or the like.

In the acoustic wave filter, each of the plurality of serial arm resonators and the plurality of parallel arm resonators is not limited to a SAW resonator and may be, for example, a bulk acoustic wave (BAW) resonator.

Each of the plurality of filters 3 may also be an LC filter.

In addition, at least one filter 3 of the plurality of filters 3 may be a duplexer used for communication supporting time division duplex (TDD). In addition, the high-frequency modules 1, 1*a*, 1*b*, 1*c*, and 1*d* may include a signal path for transmission separately from the plurality of signal paths r1 to r3.

In the high-frequency module 1*b* according to Embodiment 2, the formation location of the conductive patterns 95 of the plurality of second inductors 9 is not limited to the inside of the mounting substrate 13, and the conductive patterns 95 may be formed, for example, on the first main surface 131 of the mounting substrate 13.

In addition, the plurality of amplifiers 61 to 63 may each be a power amplifier that amplifies a transmission signal as a high-frequency signal from the signal processing circuit 301 and that outputs the signal to a corresponding one of the signal paths r1 to r3. In this case, the high-frequency modules 1, 1*a*, 1*b*, 1*c*, and 1*d* each has a signal input terminal instead of the signal output terminal 183. The input terminal of each amplifier 6 is herein connectable to the signal processing circuit 301 with the signal input terminal interposed therebetween. The signal input terminal is a terminal for inputting a high-frequency signal (transmission signal) from the external circuit (for example, the signal processing circuit 301) to a corresponding one of the high-frequency modules 1, 1*a*, 1*b*, 1*c*, and 1*d*. The signal paths r1 to r3 serve as signal paths for transmission. The plurality of filters 31 to 33 each allow a transmission signal from the corresponding amplifier 6 of the plurality of amplifiers 61 to 63 for the filters 31 to 33 on a one-to-one correspondence. The plurality of matching circuits each serves as an output matching circuit disposed between the output terminal of the corresponding amplifier 6 and the corresponding filter 3. In the case where the plurality of amplifiers 6 are each a power amplifier, the high-frequency modules 1, 1*a*, 1*b*, 1*c*, and 1*d* may further include a control circuit that controls the plurality of amplifiers 6. The control circuit is, for example, a control integrated circuit (IC) that controls the power amplifier.

In the case where the plurality of amplifiers 6 are each the power amplifier, in the high-frequency modules 1, 1*a*, 1*b*, 1*c*, and 1*d*, for example, an IC chip (GaAs-based IC chip) including the plurality of amplifiers 6 is located on the first main surface 131 of the mounting substrate 13, and the IC chip including the first switch 4, the second switch 5, the third switch 2, and the fourth switch 7 is located on the second main surface 132 of the mounting substrate 13. Note that the IC chip including the plurality of amplifiers 6 is not limited to the GaAs-based IC chip and may be, for example, a Si-based IC chip, a SiGe-based IC chip, or a GaN-based IC chip.

The high-frequency modules 1, 1a, 1b, 1c, and 1d may include not only the plurality of electronic components mounted on the mounting substrate 13 but also a circuit element disposed in the mounting substrate 13.

The high-frequency module 1 to 1d may include a multiplexer, a coupler, or the like between the antenna terminal 181 and the third switch 2. The multiplexer is, for example, a diplexer or a triplexer.

The number of third common terminals 20 in the third switch 2 is not limited to two and may be one or more than two.

Aspects

This specification discloses the following aspects.

A high-frequency module (1, 1a, 1b, 1c, and 1d) according to a first aspect includes a plurality of filters (3), a plurality of amplifiers (6), a first switch (4), a second switch (5), a first inductor (8), a plurality of second inductors (9), and a mounting substrate (13). A plurality of filters (3) are connectable to an antenna terminal (181). The first switch (4) has a first common terminal (40) and a plurality of first selection terminals (41 to 43). The first switch (4) has the plurality of first selection terminals (41 to 43) connected to the plurality of respective filters (3). The second switch (5) has a second common terminal (50) and a plurality of second selection terminals (51 to 53). The second switch (5) has the plurality of second selection terminals (51 to 53) connected to the plurality of respective amplifiers (6). The first inductor (8) is disposed on a common path (r10) between the first common terminal (40) and the second common terminal (50), the common path (r10) being included in a plurality of signal paths (r1 to r3) each of which is between a corresponding one of the plurality of amplifiers (6) and a corresponding one of the plurality of filters (3). The plurality of second inductors (9) are disposed, on a one-to-one correspondence, in sections (r11 to r13) different from the common path (r10), the sections (r11 to r13) being included in the plurality of respective signal paths (r1 to r3). The mounting substrate (13) has a first main surface (131) and a second main surface (132) that are opposite to each other. The first inductor (8) is a surface mount inductor located on the first main surface (131) of the mounting substrate (13). The plurality of second inductors (9) is an inductor disposed within an IC chip (10 and 10b) including the plurality of amplifiers (6) or an inductor including a conductive pattern (95) formed in or on the mounting substrate (13).

The high-frequency module (1, 1a, 1b, 1c, and 1d) according to the first aspect enables downsizing.

In the first aspect, in the high-frequency module (1, 1a, 1b, 1c, and 1d) according to a second aspect, an IC chip (10 and 10b) is located on the second main surface (132) of the mounting substrate (13).

The high-frequency module (1, 1a, 1b, 1c, and 1d) according to the second aspect enables downsizing more.

In the first or second aspect, in the high-frequency module (1, 1a, 1b, 1c, and 1d) according to a third aspect, the first switch (4) and the second switch (5) are included in the IC chip (10 and 10b).

The high-frequency module (1, 1a, 1b, 1c, and 1d) according to the third aspect enables downsizing more.

In any one of the first to third aspects, in the high-frequency module (1, 1a, 1b, 1c, and 1d) according to a fourth aspect, an inductance of the first inductor (8) is higher than inductances of the plurality of respective second inductors (9).

The high-frequency module (1, 1a, 1b, 1c, and 1d) according to the fourth aspect enables downsizing more.

In any one of the first to fourth aspects, in the high-frequency module (1, 1a, 1b, 1c, and 1d) according to a fifth aspect, each of the plurality of amplifiers (6) is a low-noise amplifier.

The high-frequency module (1, 1a, 1b, 1c, and 1d) according to the fifth aspect enables downsizing more.

In the fifth aspect, in the high-frequency module (1, 1a, 1b, 1c, and 1d) according to a sixth aspect, the different sections (r11 to r13) for the plurality of respective second inductors (9) are each a section that is between a corresponding one of the second selection terminals (51 to 53) and a corresponding one of the amplifiers (6) and that is included in a corresponding one of the signal paths (r1 to r3).

With the high-frequency module (1, 1a, 1b, 1c, and 1d) according to the sixth aspect, a noise figure (NF) of each of the low-noise amplifiers configured as the plurality of respective amplifiers (6) may be lowered.

In any one of the first to sixth aspects, the high-frequency module (1, 1a, 1b, 1c, and 1d) according to a seventh aspect further includes a third switch (2). The third switch (2) has a third common terminal (20) and a plurality of third selection terminals (21 to 23). The third switch (2) has the third common terminal (20) connected to the antenna terminal (181). The third switch (2) has the plurality of third selection terminals (21 to 23) connected to the plurality of respective filters (3).

In the seventh aspect, in the high-frequency module (1, 1a, 1b, 1c, and 1d) according to an eighth aspect, the third switch (2) is included in the IC chip (10 and 10b).

The high-frequency module (1, 1a, 1b, 1c, and 1d) according to the eighth aspect enables downsizing.

In the seventh or eighth aspect, the high-frequency module (1, 1a, 1b, 1c, and 1d) according to a ninth aspect further includes a fourth switch (7). The fourth switch (7) has a fourth common terminal (70) and a plurality of fourth selection terminals (71 to 73). The fourth switch (7) has the fourth common terminal (70) connected to an external connection terminal (18). The fourth switch (7) has the plurality of fourth selection terminals (71 to 73) connected to the plurality of respective amplifiers (6).

In the ninth aspect, in the high-frequency module (1, 1a, 1b, 1c, and 1d) according to a tenth aspect, the fourth switch (7) is included in the IC chip (10 and 10b).

The high-frequency module (1, 1a, 1b, 1c, and 1d) according to the tenth aspect enables downsizing.

In any one of the first to tenth aspects, in the high-frequency module according to an eleventh aspect (1, 1a, 1b, and 1d), the first inductor (8) has a first terminal (81) and a second terminal (82). For the first inductor (8), the first common terminal (40) is connected to the first terminal (81), and the second common terminal (50) is connected to the second terminal (82).

In any one of the first to tenth aspects, in the high-frequency module (1c) according to a twelfth aspect, the first inductor (8) has a first terminal (81) and a second terminal (82). The first inductor (8) has the first terminal (81) connected to a node (N1) of the common path (r10) and the second terminal (82) connected to ground (a ground terminals 185).

In the eleventh aspect, the high-frequency module (1d) according to a thirteenth aspect further includes a third inductor (12). The third inductor (12) is disposed between the common path (r10) and ground (a ground terminal 185). The third inductor (12) is a surface mount inductor located on the first main surface (131) of the mounting substrate (13).

A communication apparatus according to a fourteenth aspect (300, 300b, 300c, and 300d) includes the high-frequency module (1, 1a, 1b, 1c, and 1d) according to any one of the first to thirteenth aspects and a signal processing circuit (301). The signal processing circuit (301) is connected to the high-frequency module (1, 1a, 1b, 1c, and 1d). The signal processing circuit (301) performs signal processing of a high-frequency signal.

The communication apparatus according to the fourteenth aspect (300, 300b, 300c, and 300d) enables downsizing.

REFERENCE SIGNS LIST 1, 1a, 1b, 1c, 1d high-frequency module
2 third switch
20, 20A, 20B third common terminal
21 to 23 third selection terminal
3 filter
31 to 33 filter
4 first switch
40 first common terminal
41 to 43 first selection terminal
5 second switch
50 second common terminal
51 to 53 second selection terminal
6 amplifier
61 to 63 amplifier
7 fourth switch
70 fourth common terminal
71 to 73 fourth selection terminal
8 first inductor
81 first terminal
82 second terminal
9 second inductor
91 to 93 second inductor
95 conductive pattern
10, 10b IC chip
110 terminal
111 to 113 terminal
12 third inductor
121 first terminal
122 second terminal
13 mounting substrate
131 first main surface
132 second main surface
133 outer side-surrounding surface
14 first resin layer
141 main surface
143 outer side-surrounding surface
15 second resin layer
151 main surface
153 outer side-surrounding surface
18 external connection terminal
181 antenna terminal
182 antenna terminal
183 signal output terminal
185 ground terminal
186 control terminal
300, 300b, 300c, 300d communication apparatus
301 signal processing circuit
302 RF signal processing circuit
303 baseband-signal processing circuit
311 antenna
312 antenna
D1 depth direction
r1 to r3 signal path
r10 common path
r11 to r13 section

The invention claimed is:

1. A high-frequency module comprising:
a plurality of filters configured to be selectively connected to an antenna terminal;
a plurality of amplifiers;
a first switch having a first common terminal and a plurality of first selection terminals, the plurality of filters being respectively connected to the plurality of first selection terminals;
a second switch having a second common terminal and a plurality of second selection terminals, the plurality of amplifiers being respectively connected to the plurality of second selection terminals;
a plurality of signal paths, each signal path being between one of the plurality of filters and a corresponding one of the plurality of amplifiers, and each of the plurality of signal paths sharing a common path portion between the first common terminal of the first switch and the second common terminal of the second switch,
a first inductor connected to the common path portion;
a plurality of second inductors, each of the plurality of second inductors being in a different signal path and in a portion of the respective signal path other than the common path portion; and
a mounting substrate having a first main surface and a second main surface that are opposite to each other,
wherein the first inductor is a surface mount inductor located on the first main surface of the mounting substrate, and
wherein the plurality of second inductors are each:
an inductor disposed within an integrated circuit (IC) chip comprising the plurality of amplifiers, or
an inductor comprising a conductive pattern in or on the mounting substrate.

2. The high-frequency module according to claim 1, wherein the IC chip is located on the second main surface of the mounting substrate.

3. The high-frequency module according to claim 1, wherein the first switch and the second switch are in the IC chip.

4. The high-frequency module according to claim 1, wherein an inductance of the first inductor is higher than inductances of the plurality of second inductors.

5. The high-frequency module according to claim 1, wherein each of the plurality of amplifiers is a low-noise amplifier.

6. The high-frequency module according to claim 5, wherein the plurality of second inductors are each in a portion of the respective signal paths that is between a corresponding one of the second selection terminals and a corresponding one of the amplifiers.

7. The high-frequency module according to claim 1, further comprising:
a third switch having a third common terminal and a plurality of third selection terminals, the third common terminal being connected to the antenna terminal, and the plurality of third selection terminals being respectively connected to the plurality of filters.

8. The high-frequency module according to claim 7, wherein the third switch is in the IC chip.

9. The high-frequency module according to claim 7, further comprising:
- a fourth switch having a fourth common terminal and a plurality of fourth selection terminals, the fourth common terminal being connected to an external connection terminal, and the plurality of fourth selection terminals being respectively connected to the plurality of amplifiers.

10. The high-frequency module according to claim 9, wherein the fourth switch is in the IC chip.

11. The high-frequency module according to claim 1, wherein the first inductor has a first terminal and a second terminal, the first common terminal is connected to the first terminal, and the second common terminal is connected to the second terminal.

12. The high-frequency module according to claim 11, further comprising:
- a third inductor connected between the common path portion and ground,
- wherein the third inductor is a surface mount inductor located on the first main surface of the mounting substrate.

13. The high-frequency module according to claim 1, wherein the first inductor has a first terminal and a second terminal, the first terminal is connected to a node on the common path portion, and the second terminal is connected to ground.

14. A communication apparatus comprising:
- the high-frequency module according to claim 1; and
- a signal processing circuit that is connected to the high-frequency module and that is configured to process a high-frequency signal.

* * * * *